United States Patent
Kang (10) Patent No.: US 9,761,801 B2
(45) Date of Patent: Sep. 12, 2017

(54) INKJET PRINTHEAD AND APPARATUS AND METHOD FOR MANUFACTURING ORGANIC LUMINESCENCE DISPLAY USING THE INKJET PRINTHEAD

(71) Applicant: SAMSUNG DISPLAY CO., LTD., Yongin, Gyeonggi-Do (KR)

(72) Inventor: Jin Goo Kang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 336 days.

(21) Appl. No.: 13/907,778

(22) Filed: May 31, 2013

(65) Prior Publication Data

US 2014/0161968 A1    Jun. 12, 2014

(30) Foreign Application Priority Data

Dec. 10, 2012   (KR) .......................... 10-2012-0142802

(51) Int. Cl.
| | | |
|---|---|---|
| H05B 33/10 | (2006.01) | |
| H01L 51/00 | (2006.01) | |
| B41J 2/21 | (2006.01) | |

(52) U.S. Cl.
CPC ......... *H01L 51/0005* (2013.01); *B41J 2/2114* (2013.01)

(58) Field of Classification Search
None
See application file for complete search history.

(56) References Cited

U.S. PATENT DOCUMENTS

| | | | |
|---|---|---|---|
| 2010/0104740 A1* | 4/2010 | Shinohara | B41J 2/15 427/66 |
| 2012/0040478 A1* | 2/2012 | Takeuchi | H01L 27/3246 438/23 |

FOREIGN PATENT DOCUMENTS

| | | | |
|---|---|---|---|
| JP | 2002-252083 A | | 9/2002 |
| JP | 2004-031070 | | 1/2004 |
| JP | 2004-31070 A | | 1/2004 |
| JP | 2004031070 | * | 1/2004 |
| JP | 2005-63980 A | | 3/2005 |
| JP | 2006-278127 A | | 10/2006 |
| JP | 2008-207084 A | | 9/2008 |
| JP | 2009-176438 A | | 8/2009 |
| JP | 2010-277944 A | | 12/2010 |

(Continued)

OTHER PUBLICATIONS

SIPO Office action dated Mar. 31, 2016, with English translation, corresponding to Chinese Patent application 201310412468.7, (16 pages).

(Continued)

*Primary Examiner* — Nathan T Leong
(74) *Attorney, Agent, or Firm* — Lewis Roca Rothgerber Christie LLP (57) ABSTRACT

An inkjet printhead, and an apparatus and method for manufacturing an organic luminescence display using the inkjet printhead. An apparatus for manufacturing an organic luminescence display including an inkjet printhead placeable over a substrate and including a plurality of nozzles; and a moving unit configured to move at least one of the inkjet printhead or the substrate relative to the other, and the plurality of nozzles includes one or more ink ejecting nozzles ejecting an organic light-emitting ink; and one or more solvent ejecting nozzles ejecting a first solvent.

7 Claims, 11 Drawing Sheets

FIG. 1

(56) References Cited

FOREIGN PATENT DOCUMENTS

KR   10-2006-0135265 A   12/2006
KR   10-2007-0118744 A   12/2007
KR   10-2007-0121293 A   12/2007

OTHER PUBLICATIONS

English translation of TIPO Office Action dated Nov. 8, 2016, for corresponding Taiwanese Patent Application No. 102131592 (4 pages), previously submitted in an IDS on Dec. 5, 2016.
JPO Office Action dated Dec. 20, 2016, for corresponding Japanese Patent Application No. 2013-126715 (5 pages).
TIPO Office Action dated Nov. 8, 2016, for corresponding Taiwanese Patent Application No. 102131592 (5 pages).

\* cited by examiner

INKJET PRINTHEAD AND APPARATUS AND METHOD FOR MANUFACTURING ORGANIC LUMINESCENCE DISPLAY USING THE INKJET PRINTHEAD

CROSS-REFERENCE TO RELATED APPLICATION

This application claims priority to and the benefit of Korean Patent Application No. 10-2012-0142802, filed on Dec. 10, 2012 in the Korean Intellectual Property Office, the entire content of which is incorporated herein by reference.

BACKGROUND

1. Field

Aspects of embodiments of the present invention relate to an inkjet printhead and an apparatus and method for manufacturing an organic luminescence display using the inkjet printhead.

2. Description of the Related Art

Displays, which display various information on a screen, are core technology of the information and telecommunication age and are developing into thinner, lighter, portable, and high-performance displays. Accordingly, flat panel displays (such as organic luminescence displays) which can overcome disadvantages (i.e. weight and volume) of cathode ray tubes (CRTs) are attracting a lot of attention. An organic luminescence display is a self-emitting device that uses a thin organic light-emitting layer between electrodes. The organic luminescence display can be made as thin as paper. Organic luminescence displays can be classified into small-molecule organic luminescence displays and polymer organic luminescence displays according to the material of an organic light-emitting layer that generates light. Generally, an organic light-emitting layer of a small-molecule organic luminescence display is formed as a thin film by vacuum deposition, and an organic light-emitting layer of a polymer organic luminescence display is formed as a thin film using a solution coating method such as spin coating or inkjet printing.

When an organic light-emitting layer is formed by inkjet printing, organic light-emitting ink, which includes an organic light-emitting material and a solvent, is ejected from an inkjet printhead onto one or more pixels on a substrate in a display region, and then the ejected organic light-emitting ink is dried into the organic light-emitting layer. Here, when the organic light-emitting ink dries, it means that the solvent contained in the organic light-emitting ink evaporates. Typically, the solvent is highly volatile. Therefore, the solvent may be volatilized shortly after the organic light-emitting ink is ejected, thereby drying the organic light-emitting ink. Here, the concentration of molecules of the evaporating solvent (hereinafter, referred to as the concentration of evaporating solvent molecules) may be high in the center of a region to which the organic light-emitting ink was ejected and may be low at an edge of the region to which the organic light-emitting ink was ejected, that is, at a boundary between the region to which the organic light-emitting ink was ejected and a region to which the organic light-emitting ink was not ejected. This non-uniformity in the concentration gradient of the evaporating solvent molecules on the substrate may induce the evaporating solvent molecules to diffuse from the center of the region to which the organic light-emitting ink was ejected to the edge of the region to which the organic light-emitting ink was ejected. In addition, the edge of the region to which the organic light-emitting ink was ejected may dry relatively faster than the center of the region to which the organic light-emitting ink was ejected. Therefore, an organic light-emitting layer of a pixel located at the edge of the region to which the organic light-emitting ink was ejected may be concentrated toward the outside of the region. That is, the organic light-emitting layer of the pixel at the edge of the region to which the organic light-emitting ink was ejected may have a non-uniform thickness. The non-uniform thickness directly affects the display quality of the organic luminescence display.

SUMMARY

According to an aspect of embodiments of the present invention, an apparatus for manufacturing an organic luminescence display may eject a solvent around a region to which organic light-emitting ink including an organic light-emitting material and a solvent is ejected, such that the ejected organic light-emitting ink may be dried under a uniform concentration of evaporating solvent molecules.

According to another aspect of embodiments of the present invention, a method of manufacturing an organic luminescence display is provided, in which a solvent is ejected around a region to which organic light-emitting ink including an organic light-emitting material and a solvent is ejected, such that the ejected organic light-emitting ink may be dried under a uniform concentration of evaporating solvent molecules.

According to another aspect of embodiments of the present invention, an inkjet printhead used to manufacture an organic luminescence display is configured to eject a solvent around a region to which organic light-emitting ink including an organic light-emitting material and a solvent is ejected, such that the ejected organic light-emitting ink may be dried under a uniform concentration of evaporating solvent molecules.

However, aspects of embodiments of the present invention are not limited to those set forth herein. The above and other aspects of the present invention will become more apparent to one of ordinary skill in the art to which the present invention pertains by referencing the description of some embodiments of the present invention, as set forth below.

According to an embodiment of the present invention, an apparatus for manufacturing an organic luminescence display includes: an inkjet printhead placeable over a substrate and including a plurality of nozzles; and a moving unit configured to move at least one of the inkjet printhead or the substrate relative to the other, and the plurality of nozzles includes one or more ink ejecting nozzles ejecting an organic light-emitting ink; and one or more solvent ejecting nozzles ejecting a first solvent.

According to another embodiment of the present invention, a method of manufacturing an organic luminescence display includes: ejecting a mixture of an organic light-emitting material and a solvent onto one or more pixels arranged on a substrate and ejecting the solvent around the one or more pixels; and drying the mixture and the solvent.

According to another embodiment of the present invention, a method of manufacturing an organic luminescence display includes: first ejecting a first organic light-emitting ink onto a first pixel region of a substrate, and first ejecting a first solvent around the first pixel region; and first drying the first organic light-emitting ink and the first solvent.

According to another embodiment of the present invention, an inkjet printhead includes: a plurality of nozzles arranged in a row in a direction; and a head holder supporting the nozzles, and the plurality of nozzles include one or more solvent ejecting nozzles ejecting a first solvent; and one or more ink ejecting nozzles ejecting an organic light-emitting ink including an organic light-emitting material and a second solvent having a same composition as the first solvent.

Embodiments of the present invention may provide an organic light-emitting layer having a uniform or substantially uniform thickness.

In addition, embodiments of the present invention for manufacturing an organic luminescence display may save manufacturing costs by using a solvent that is relatively less costly than the organic light-emitting ink.

BRIEF DESCRIPTION OF THE DRAWINGS

The above and other aspects and principles of the present invention will become more apparent by describing in further detail some exemplary embodiments thereof with reference to the attached drawings, in which.

DETAILED DESCRIPTION

The present invention is described more fully hereinafter with reference to the accompanying drawings, in which some exemplary embodiments of the invention are shown. However, as those skilled in the art would realize, the described embodiments may be modified in various different ways, all without departing from the spirit or scope of the present invention. Accordingly, the drawings and description are to be regarded as illustrative in nature and not restrictive. Like reference numbers indicate like components throughout the specification.

The term "on" that is used to designate that an element is on another element or located on a different layer or a layer includes both a case where an element is located directly on another element or a layer and a case where an element is located on another element via another layer or still another element. In the description of the present invention, like reference numbers indicate like components throughout the specification and figures.

Although the terms "first, second, and so forth" may be used herein to describe various constituent elements, such constituent elements are not limited by the terms. The terms are used only to differentiate a constituent element from other constituent elements. Accordingly, in the following description, a first constituent element may be a second constituent element.

Hereinafter, some embodiments of the present invention will be described with reference to the attached drawings.

Figure 1:
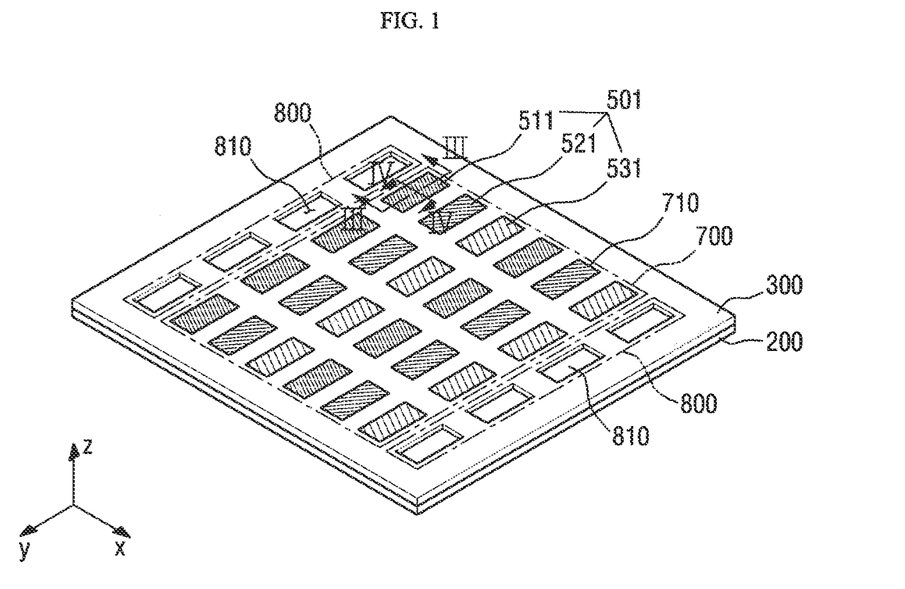
FIG. 1 is a perspective view of an organic luminescence display manufactured using an apparatus and method for manufacturing an organic luminescence display according to embodiments of the present invention.
Figure 2:
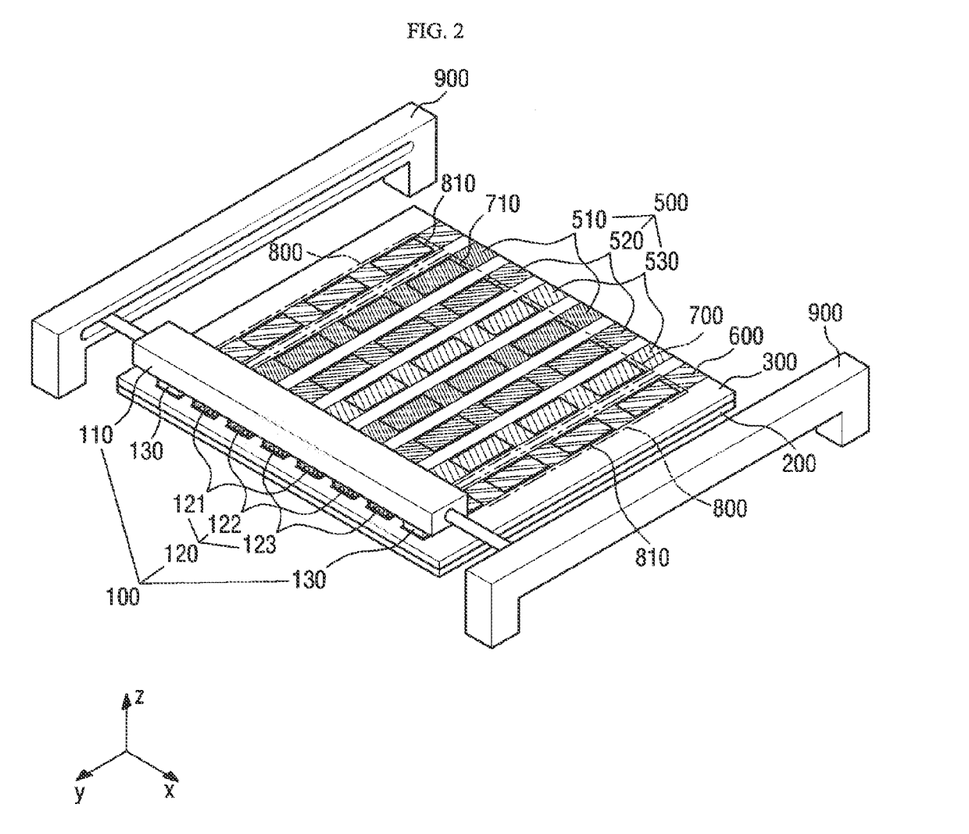
FIG. 2 is a perspective view illustrating an apparatus and method for manufacturing an organic luminescence display according to an embodiment of the present invention.
Figure 3:
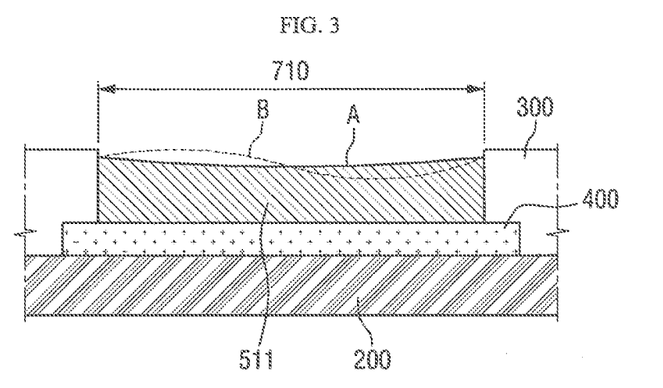
FIG. 3 is a partial cross-sectional view of the organic luminescence display of FIG. 1, taken along the line III-III'.
Figure 4:
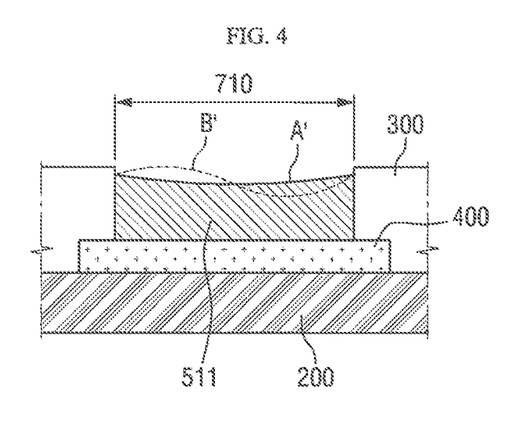
FIG. 4 is a partial cross-sectional view of the organic luminescence display of FIG. 1, taken along the line IV-IV'.

FIG. 1 is a perspective view of an organic luminescence display manufactured using an apparatus and method for manufacturing an organic luminescence display according to embodiments of the present invention. FIG. 2 is a perspective view illustrating an apparatus and method for manufacturing an organic luminescence display according to an embodiment of the present invention. FIG. 3 is a partial cross-sectional view of the organic luminescence display of FIG. 1, taken along the line III-III'. FIG. 4 is a partial cross-sectional view of the organic luminescence display of FIG. 1, taken along the line IV-IV'.

In the description below, apparatuses and methods for manufacturing an organic luminescence display may include various apparatuses and methods using an inkjet printing method. In addition to the apparatuses and methods using the inkjet printing method, an apparatus and method for coating a liquid or semi-solid organic light-emitting material on a substrate 200 may be included in the apparatuses and methods for manufacturing an organic luminescence display according to embodiments of the present invention.

An apparatus for manufacturing an organic luminescence display according to an embodiment of the present invention will now be described with reference to FIGS. 1 through 4. Referring to FIGS. 1 through 4, the apparatus for manufacturing an organic luminescence display includes an inkjet printhead 100 and a moving unit 900.

The inkjet printhead 100 may be placed over the substrate 200. In one embodiment, the substrate 200 may be a unit display substrate 200 or may be a mother substrate before being cut and split into a plurality of unit display substrates 200. In addition, the substrate 200 may be a substrate without a structure or a substrate having at least part of a structure formed thereon. The structure formed on the substrate 200 may be a complete structure or an incomplete structure. The substrate 200 may be a single substrate 200 or may be a stack of multiple substrates 200.

The substrate 200 may be divided into a display region 700 and a non-display region. The display region 700 may be a region in which images are displayed, and the non-display region may be a region in which no images are displayed, that is, all regions of the substrate 200 excluding the display region 700. A plurality of pixels 710 may be located in the display region 700 of the substrate 200. Each of the pixels 710 may have a cuboid or a rectangular prismatic shape, for example. The pixels 710 may be arranged in an n×m matrix form, where n and m are integers of 1 or more. In one embodiment, as shown in FIGS. 1 and 2, where a row direction is an x-axis direction and a column direction is a y-axis direction, the pixels 710 may be arranged in a 4×6 matrix form in the display region 700. However, the arrangement of the pixels 710 shown in FIGS. 1 and 2 is merely one embodiment used as an example for ease of description. In other embodiments, more or less pixels 710 than that shown in FIGS. 1 and 2 may be arranged on the substrate 200. In addition, the pixels 710 can be arranged in various forms (e.g., a striped form and a PENTILE form), as well as the matrix form. PENTILE is a registered trademark owned by Samsung Display Co., Ltd.

A driver (not shown) may be formed in the non-display region of the substrate 200. Patterned structures, such as the pixels 710, do not usually exist in the non-display region, except for the driver. However, as shown in FIGS. 1 and 2, a dummy region 800 may be formed in a portion of the non-display region adjacent to the display region 700, and one or more dummy patterns 810 may be formed within the dummy region 800. The dummy patterns 810 may have the same shape as the pixels 710 and may be formed on a side of the pixels 710 as a whole to be arranged in the same form in which the pixels 710 are arranged. In one embodiment, as shown in FIGS. 1 and 2, two columns of dummy patterns 810 may be formed at both ends of the substrate 200, respectively, and the dummy patterns 810 may be formed to have the same shape as the pixels 710. Furthermore, since the dummy patterns 810 are arranged in the same form in which the pixels 710 are arranged, all patterns (including the pixels 710 and the dummy patterns 810) on the substrate 200 may be arranged in the n×m matrix form. In one embodiment, as shown in FIGS. 1 and 2, all patterns may be arranged in a 4×8 matrix form, for example. However, embodiments of the present invention are not limited thereto.

A pixel defined layer 300 may be formed on the substrate 200. The pixel defined layer 300, as its name suggests, may define regions in which the pixels 710 are formed within the display region 700. In the embodiment of FIGS. 1 and 2, regions surrounded by the pixel defined layer 300 may define the pixels 710. In addition to what its name suggests, the pixel defined layer 300 may define regions in which the dummy patterns 810 are formed within the dummy region 800. That is, in the embodiment of FIGS. 1 and 2, regions surrounded by the pixel defined layer 300 may define the dummy patterns 810. The pixel defined layer 300 may be made of an insulating material and may be formed by a mask patterning process, such as a patterning process using a fine metal mask, for example. In one embodiment, a surface of the pixel defined layer 300 may be coated with a fluorine-containing material. In one embodiment, the pixel defined layer 300 itself may contain fluorine. In one embodiment, after the pixel defined layer 300 is formed, it may be treated with fluorine plasma. The fluorine treatment of the pixel defined layer 300 may reduce a surface energy of the pixel defined layer 300, thereby preventing or substantially preventing adhesion of foreign matter to a surface of the pixel defined layer 300.

An electrode 400 may be formed on a portion of the substrate 200 which corresponds to each of the pixels 710. The electrode 400 may cause an organic light-emitting layer 501 (which will be described later) to emit light by applying a voltage to each of the pixels 710. The electrode 400 may be formed to directly contact the substrate 200, and each of the pixels 710 may be defined on the electrode 400. That is, a region surrounded by the electrode 400 and the pixel defined layer 300 may be defined as each of the pixels 710. In one embodiment, the electrode 400 may be a transparent electrode and an anode. The electrode 400 may be formed in a same manner as the pixel defined layer 300 is formed. However, the electrode 400 may be formed before the pixel defined layer 300, and different masks may be used to form the electrode 400 and the pixel defined layer 300.

In one embodiment, the inkjet printhead 100 includes a head holder 110 and a plurality of nozzles. The head holder 110 may support the nozzles. The head holder 110, in one embodiment, may extend in a first direction parallel to a surface of the substrate 200, may be parallel to a side of the substrate 200, and may be separated from the substrate 200 by a distance (e.g., a predetermined distance). The head holder 110 may be, but is not limited to, cuboid-shaped or rectangular prismatic-shaped. The nozzles may be installed on a surface of the head holder 110 which faces the surface of the substrate 200. The area of the surface of the head holder 110 which faces the surface of the substrate 200 may be smaller than the area of the surface of the substrate 200. However, the present invention is not limited thereto, and the area of the surface facing the surface of the substrate 200 may be equal to or larger than the area of the surface of the substrate 200. Although not shown in the drawings, the head holder 110 may be connected to the moving unit 900 which moves the inkjet print head 100 and/or a control unit which controls a moving speed or direction of the inkjet printhead 100.

The nozzles may be arranged in a row in the first direction parallel to the surface of the substrate 200. Alternatively, the nozzles may be arranged in multiple rows, that is, in a matrix form. However, the present invention is not limited thereto, and the nozzles can be arranged in various forms (such as the PENTILE form) corresponding to the forms in which the pixels 710 are arranged. In one embodiment, the nozzles may be arranged parallel to the side of the substrate 200. In one embodiment, as shown in FIG. 2, multiple nozzles (e.g., eight nozzles) may be arranged in a row in the x-axis direction. In some cases, the nozzles may be arranged obliquely to the side of the substrate 200. The nozzles may be spaced at regular intervals. However, the present invention is not limited thereto, and, in other embodiments, the nozzles may be spaced at irregular intervals and arranged in a form corresponding to a form in which the pixels 710 are arranged on the substrate 200.

The moving unit 900 may move the inkjet printhead 100 or the substrate 200. The moving unit 900 may be connected to the head holder 110. In one embodiment, in a state in which the substrate 200 is fixed, the moving unit 900 may move the inkjet printhead 100 in a second direction perpendicular to the first direction in which the nozzles are arranged and parallel to the surface of the substrate 200. In one embodiment, in a state in which the substrate 200 is fixed, the moving unit 900 may move the inkjet printhead 100 in a y-axis direction or a direction opposite the y-axis direction. In addition, the moving unit 900 may be connected to a substrate support (not shown). In one embodiment, in a state in which the inkjet printhead 100 is fixed, the moving unit 900 may move the substrate 200 in the second direction perpendicular to the first direction in which the nozzles are arranged and parallel to the surface of the substrate 200. In one embodiment, in a state in which the inkjet printhead 100 is fixed, the moving unit 900 may move the substrate 200 in the y-axis direction or the direction opposite the y-axis direction. In another embodiment, both the inkjet printhead 100 and the substrate 200 may be moved relative to each other.

The nozzles, in one embodiment, include one or more ink ejecting nozzles 120 which eject organic light-emitting ink 500 and one or more solvent ejecting nozzles 130 which eject a first solvent 600. In FIG. 2, the ink ejecting nozzles 120 are shaded for clarity, and the solvent ejecting nozzles 130 are not shaded.

Figure 7:
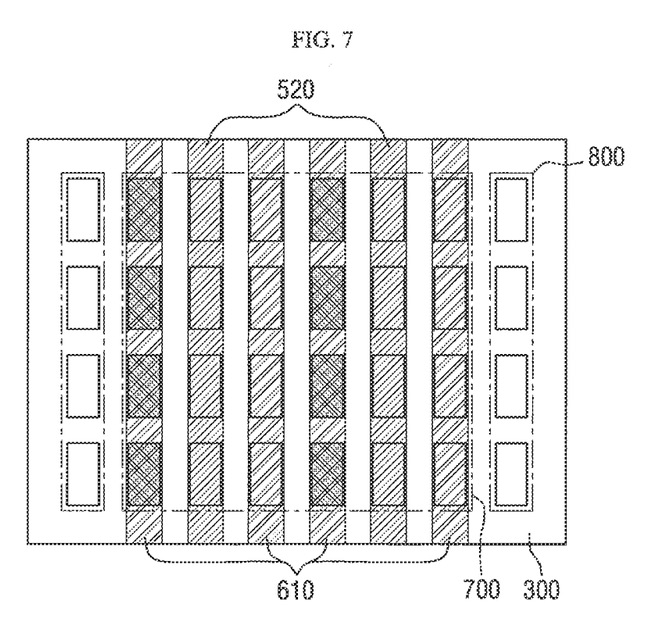

The organic light-emitting ink 500 may be a material for forming the organic light-emitting layer 501 and may include an organic light-emitting material and a second solvent 610 (see FIG. 7). That is, as the organic light-emitting ink 500 dries on the substrate 200, all of the second solvent 610 may evaporate, resulting in the formation of the organic light-emitting layer 501. The organic light-emitting material may be a red organic light-emitting material, a green organic light-emitting material, or a blue organic light-emitting material. When a voltage is applied to the organic light-emitting material, the organic light-emitting material may emit red, green or blue light. The second solvent 610 is used to melt the organic light-emitting material into a liquid state and may be a material that is highly volatile and mixes well with the organic light-emitting material. The second solvent 610 may have the same composition as the first solvent 600. However, the present invention is not limited thereto. The organic light-emitting ink 500 may include a dispersing agent and/or a bonding agent in addition to the organic light-emitting material and the second solvent 610.

The organic light-emitting ink 500 may include a red ink 510 including the red organic light-emitting material and the second solvent 610, a green ink 520 including the green organic light-emitting material and the second solvent 610, and a blue ink 530 including the blue organic light-emitting material and the second solvent 610. When the second solvent 610 evaporates by the drying of the red ink 510, the green ink 520 and the blue ink 530, a red light-emitting layer 511, a green light-emitting layer 521, and a blue light-emitting layer 531 may be formed, respectively.

The ink ejecting nozzles 120 may include at least one of a red ink ejecting nozzle 121 which ejects the red ink 510, a green ink ejecting nozzle 122 which ejects the green ink 520, and a blue ink ejecting nozzle 123 which ejects the blue ink 530. In one embodiment, one set of the red ink ejecting nozzle 121, the green ink ejecting nozzle 122 and the blue ink ejecting nozzle 123 may be formed, and this set may be repeated. In the embodiment of FIG. 2, for example, two sets of the red ink ejecting nozzle 121, the green ink ejecting nozzle 122, and the blue ink ejecting nozzle 123 may be arranged in a row. However, the present invention is not limited thereto, and the red ink ejecting nozzle 121, the green ink ejecting nozzle 122, and the blue ink ejecting nozzle 123 may be arranged in various other orders and forms.

The first solvent 600 may be a material that can melt the organic light-emitting material into a liquid state and may be a material that is highly volatile and mixes well with the organic light-emitting material. As described above, the first solvent 600 may have the same composition as the second solvent 610. However, the present invention is not limited thereto. In one embodiment, the first solvent 600 may be less volatile than the second solvent 610. The first solvent 600 may evaporate rapidly (e.g., within a few seconds) after it is ejected. That is, a region to which the first solvent 600 is ejected may be restored to its original state after a certain period of time unless the region to which the first solvent 600 is ejected absorbs the first solvent 600 or the first solvent 600 causes a chemical reaction in the region to which the first solvent 600 is ejected.

In one embodiment, the solvent ejecting nozzles 130 may eject a highly volatile material other than the first solvent 600. In this case, the material can be ejected to any region of the substrate 200 as long as a region to which the material is ejected can be restored to its original state after a certain period of time. However, if the region to which the material is ejected becomes denatured, the material may be ejected onto the non-display region to not affect characteristics of an organic luminescence display.

The solvent ejecting nozzles 130 may be located at one or more ends of multiple nozzles arranged in a row in the first direction. If the multiple nozzles are arranged in a row in the first direction, an end may be a first nozzle or a last nozzle. In one embodiment, the solvent ejecting nozzles 130 may be located at both ends of the multiple nozzles. In another embodiment, the ink ejecting nozzles 120 and the solvent ejecting nozzles 130 may be arranged alternately, and the solvent ejecting nozzles 130 may be located at both ends of the multiple nozzles.

The apparatus for manufacturing an organic luminescence display according to one embodiment may eject the first solvent 600 around a region to which the organic light-emitting ink 500 is ejected. In one embodiment, at the same time as when the ink ejecting nozzles 120 eject the organic light-emitting ink 500 to one or more of the pixels 710 on the substrate 200, the solvent ejecting nozzles 130 may eject the first solvent 600 around the pixels 710 to which the organic light-emitting ink 500 is ejected. In another embodiment, the solvent ejecting nozzles 130 may eject the first solvent 600 onto at least part of the non-display region. In one embodiment, the solvent ejecting nozzles 130 may eject the first solvent 600 onto the dummy region 800. The first solvent 600 ejected onto the dummy patterns 810 may fill the dummy patterns 810.

In one embodiment, the apparatus for manufacturing an organic luminescence display may eject the organic light-emitting material and the first solvent 600 onto the substrate 200 in the form of a line by using a line printing method. In the embodiment of FIG. 2, the nozzles arranged in a row in the x-axis direction may move in the y-axis direction while ejecting the organic light-emitting ink 500 and the first solvent 600 onto the display region 700 and the dummy region 800 of the substrate 200, respectively. In this case, the pixels 710 within the display region 700 may be filled with the organic light-emitting ink 500, and the dummy patterns 810 within the dummy region 800 may be filled with the first solvent 600. In one embodiment, the organic light-emitting ink 500 and the first solvent 600 may be ejected in the form of continuous lines. In this case, the organic light-emitting ink 500 and the first solvent 600 may be coated on the pixels 710, the dummy patterns 810, respectively, and the pixel defined layer 300 located on the movement path of the nozzles. If the pixel defined layer 300 is treated with fluorine as described above, the organic light-emitting ink 500 and the first solvent 600 may be pulled toward the pixels 710 and the dummy patterns 810, respectively. The movement path of the nozzles may extend from an end of the substrate 200 to another end which is opposite the end. Therefore, the organic light-emitting ink 500 may be ejected onto at least part of the non-display region adjacent to the display region 700. The apparatus for manufacturing an organic luminescence display may use a dot-printing method as well as the line-printing method. In this case, the apparatus for manufacturing an organic luminescence display may selectively eject the organic light-emitting ink 500 and the first solvent 600 onto the pixels 710 and the dummy patterns 810, respectively.

In the apparatus for manufacturing an organic luminescence display according to one embodiment, the organic light-emitting ink 500 ejected from the inkjet printhead 100 onto the pixels 710 of the substrate 200 is dried under a uniform concentration of evaporating solvent molecules due to the organic light-emitting ink 500 and/or the first solvent 600 around the pixels 710. As a result, the organic light-emitting layer 501 having a uniform thickness may be formed. This is described further below with reference to FIGS. 3 and 4.

FIG. 3 is a cross-sectional view of the organic light-emitting display in which the organic light-emitting ink 500 ejected onto the substrate 200 in an inkjet printing manner has dried, taken along the line of FIG. 1. That is, FIG. 3 is a cross-sectional view taken along the same direction as the movement direction of the nozzles. First, the organic light-emitting ink 500, i.e. the red ink 510, may be ejected onto only a pixel 710 of FIG. 3 and may not be ejected onto the pixel defined layer 300 adjacent the pixel 710 of FIG. 3 in the y-axis direction or the direction opposite the y-axis direction. In this case, an interface of the red light-emitting layer 511 formed in the pixel 710 is defined as "an uncorrected interface B of the red light-emitting layer 511." In one embodiment, the red ink 510 can be ejected not only onto the pixel 710 of FIG. 3 but also onto the pixel defined layer 300 adjacent the pixel 710 of FIG. 3 in the y-axis direction or the direction opposite the y-axis direction. In this case, an interface of the red light-emitting layer 511 formed in the pixel 710 of FIG. 3 is defined as "a corrected interface A of the red light-emitting layer 511." If the two interfaces are compared, the uncorrected interface B of the red light-emitting layer 511 may be uneven because the concentration of evaporating solvent molecules around the pixel 710 of FIG. 3, in particular, the concentration of evaporating solvent molecules in the direction opposite the y-axis direction from the pixel 710 of FIG. 3 is lower than the concentration of evaporating solvent molecules in the pixel 710 of FIG. 3, and the red ink 510 adjacent the pixel 710 of FIG. 3 in the direction opposite the y-axis direction dries relatively faster. However, the corrected interface A of the red light-emitting layer 511 may be even or relatively even because the red ink 510 ejected onto the pixel defined layer 300 causes the concentration of evaporating solvent molecules around the pixel 710 of FIG. 3 to be similar to the concentration of evaporating solvent molecules in the pixel 710 of FIG. 3, and thus the red ink 510 is dried under the uniform concentration of evaporating solvent molecules across the pixel 710 of FIG. 3.

FIG. 4 is a cross-sectional view of the organic light-emitting display in which the organic light-emitting ink 500 ejected onto the substrate 200 in an inkjet printing manner has dried, taken along the line IV-IV' of FIG. 1. That is, FIG. 4 is a cross-sectional view taken along a direction perpendicular to the movement direction of the nozzles. First, the organic light-emitting ink 500, i.e. the red ink 510, may be ejected onto only a pixel 710 of FIG. 4 and may not be ejected onto a dummy pattern adjacent from the pixel 710 of FIG. 4 in the direction opposite the x-axis direction. In this case, an interface of the red light-emitting layer 511 formed in the pixel 710 of FIG. 4 is defined as "an uncorrected interface B' of the red light-emitting layer 511." In one embodiment, the red ink 510 can be ejected not only onto the pixel 710 of FIG. 4 but also onto the dummy pattern adjacent from the pixel 710 of FIG. 4 in the direction opposite the x-axis direction. In this case, an interface of the red light-emitting layer 511 formed in the pixel 710 of FIG. 4 is defined as "a corrected interface A' of the red light-emitting layer 511." If the two interfaces are compared, the uncorrected interface B' of the red light-emitting layer 511 may be uneven because the concentration of evaporating solvent molecules around the pixel 710 of FIG. 4, in particular, the concentration of evaporating solvent molecules in the direction opposite the x-axis direction from the pixel 710 of FIG. 4 is lower than the concentration of evaporating solvent molecules in the pixel 710 of FIG. 4, and the red ink 510 adjacent from the pixel 710 of FIG. 4 in the direction opposite the x-axis direction dries relatively faster. However, the corrected interface A' of the red light-emitting layer 511 may be even or relatively even because the red ink 510 ejected onto the dummy pattern causes the concentration of evaporating solvent molecules around the pixel 710 of FIG. 4 to be similar to the concentration of evaporating solvent molecules in the pixel 710 of FIG. 4, and thus the red ink 510 is dried under the uniform concentration of evaporating solvent molecules across the pixel 710 of FIG. 4.

In addition to the above-described effects, the apparatus for manufacturing an organic luminescence display according to embodiments of the present invention can save manufacturing costs by using a solvent relatively less costly than the organic light-emitting ink 500.

Figure 5:
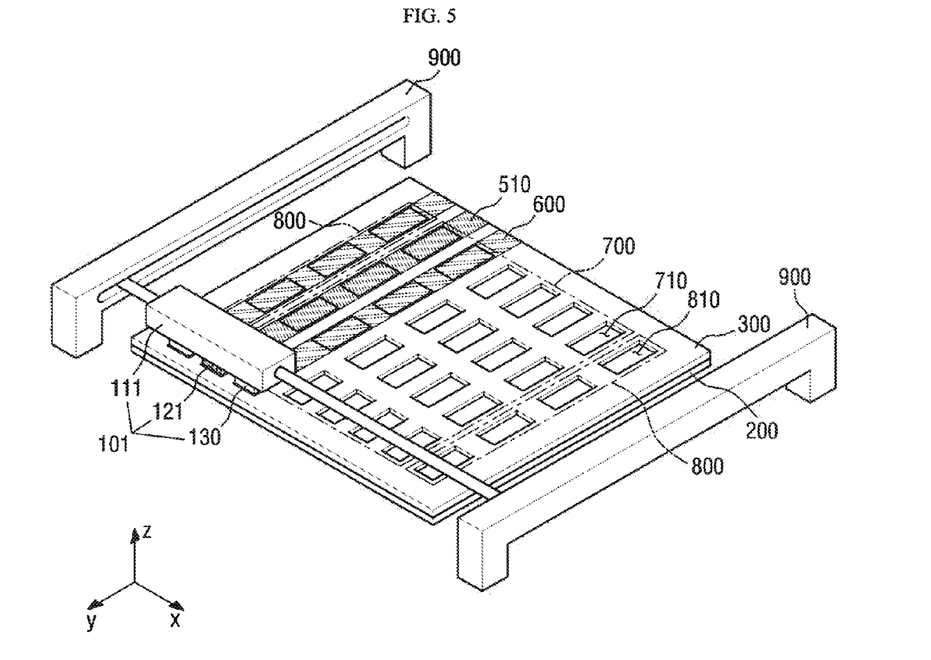
FIG. 5 is a perspective view illustrating an apparatus and method for manufacturing an organic luminescence display according to another embodiment of the present invention.

An apparatus for manufacturing an organic luminescence display according to another embodiment of the present invention will now be described with reference to FIG. 5. FIG. 5 is a perspective view illustrating an apparatus and method for manufacturing an organic luminescence display according to another embodiment of the present invention. For simplicity, elements which are the same as those of FIGS. 1 through 4 are indicated by like reference numerals, and repeated description thereof will be omitted.

In an inkjet printhead 101 of the apparatus for manufacturing an organic luminescence display according to another embodiment, one type of ink ejecting head is installed at a head holder 111. In the embodiment of FIG. 5, the inkjet printhead 101 may include solvent ejecting nozzles 130 at both ends thereof and a red ink ejecting nozzle 121 in the middle. While moving in a reciprocating manner, the inkjet printhead 101 may eject red ink 510 to pixels 710 on a substrate 200 in a line printing or dot printing manner. In another embodiment, the inkjet printhead 101 may be extended in a first direction, that is, in an x-axis direction of FIG. 5 and may include a plurality of red ink ejecting nozzles 121. In this case, a red light-emitting layer 511 may be formed on the entire substrate 200 by one scanning of the inkjet printhead 101 and drying.

Although not shown in FIG. 5, the apparatus for manufacturing an organic luminescence display according to one embodiment may additionally include an inkjet printhead 101 which includes a green ink ejecting nozzle 122 and solvent ejecting nozzles 130 and an inkjet printhead 101 which includes a blue ink ejecting nozzle 123 and solvent ejecting nozzles 130. The inkjet printheads 101 may individually eject organic light-emitting ink 500, that is, the red ink 510, green ink 520, and blue ink 530 onto the substrate 200. In one embodiment, the inkjet printheads 101 may be arranged in a stepped manner when seen in a plan view. Thus, they may successively eject the red ink 510, the green ink 520, and the blue ink 530.

A method of manufacturing an organic luminescence display according to an embodiment of the present invention will now be described with reference to FIGS. 1 through 4. For simplicity, elements which are the same as those of the above-described apparatus for manufacturing an organic luminescence display are indicated by like reference numerals, and repeated description thereof will be omitted.

Referring to FIGS. 1 and 2, the method of manufacturing an organic luminescence display according to one embodiment includes an operation of ejecting a mixture (i.e. organic light-emitting ink 500) of an organic light-emitting material and a second solvent 610 onto one or more pixels 710 arranged on a substrate 200 and ejecting a first solvent 600 onto a region around each of the pixels 710. Here, the region around each of the pixels 710 may include not only other pixels 710 or dot patterns adjacent to the corresponding pixel 710 but also a pixel defined layer 300 adjacent to the corresponding pixel 710. In addition, the organic light-emitting ink 500 as well as the first solvent 600 may be ejected onto the region around each of the pixels 710. As described above, the first solvent 600 and the second solvent 610 may have the same composition. In addition, the ejecting operation may be performed in a line printing or dot printing manner using the inkjet printhead 100.

The first solvent 600 may be ejected in the form of a line onto a non-display region adjacent to at least one boundary of a display region 700. In one embodiment, the first solvent 600 may be ejected in the form of lines onto a dummy region 800 adjacent to both ends of the display region 700. In this case, the first solvent 600 may be ejected not only onto one or more dummy patterns formed adjacent to the display region 700 but also onto the pixel defined layer 300 adjacent to the display region 700. In another exemplary embodiment, the first solvent 600 may also be ejected onto the non-display region adjacent to edges (e.g., all edges) of the display region 700.

The method of manufacturing an organic luminescence display according to one embodiment may include an operation of drying the organic light-emitting ink 500 and the first solvent 600 after the ejecting operation. In the drying operation, since the concentration gradient of evaporating solvent molecules on the substrate 200 is uniform, an organic light-emitting layer 501 may be formed to a uniform thickness on the substrate 200, particularly, on the display region 700. This has already been described above with reference to FIGS. 3 and 4. In addition, since all of the solvent ejected onto the region around each of the pixels 710 evaporates, it does not affect an organic light-emitting display.

FIGS. 6 through 9 are plan views illustrating a method of manufacturing an organic luminescence display according to another embodiment of the present invention. For simplicity, elements substantially the same as those of FIGS. 1 through 4 are indicated by like reference numerals, and thus repeated description thereof will be omitted.

Figure 6:
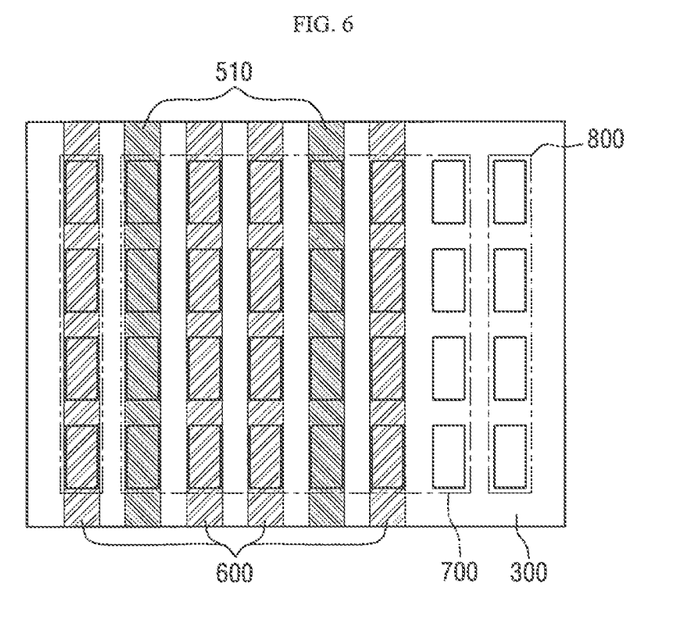
FIGS. 6 through 9 are plan views illustrating a method of manufacturing an organic luminescence display according to another embodiment of the present invention.

Referring to FIG. 6, the method of manufacturing an organic luminescent display according to one embodiment may include a first ejecting operation, a first drying operation, a second ejecting operation, a second drying operation, a third ejecting operation, and a third drying operation.

In the first ejecting operation, first organic light-emitting ink may be ejected onto a first pixel region on a substrate 200, and a first solvent 600 may be ejected onto a region around the first pixel region. Here, the first pixel region may be a region including pixels 710 in which a red light-emitting layer 511 is formed, and the first organic light-emitting ink may be red ink 510. In addition, if the first organic light-emitting ink is ejected in the form of a line by line printing, the region around the first pixel region may be lines on both sides of the line of the ejected first organic light-emitting ink. In the embodiment shown in FIG. 6, the red ink 510 may be ejected in the form of a line from an end of the substrate 200 to the other end of the substrate 200, and the first solvent 600 may be ejected in the form of lines on both sides of the ejected red ink 510. In one embodiment, for example, a total of two lines of the red ink 510 and four lines of the first solvent 600 may be ejected.

In the first drying operation, the first organic light-emitting ink and the first solvent 600 may be dried after the first ejecting operation. The first organic light-emitting ink (e.g., the red ink 510) may be dried into an organic light-emitting layer 501 (e.g., the red light-emitting layer 511). In addition, the first solvent 600 may evaporate as it dries, and, as a result, all of the first solvent 600 may be removed. Since the red ink 510 is dried in a uniform drying atmosphere due to the presence of the first solvent 600 on both sides of the red ink 510, it can be formed into the red light-emitting layer 511 having a uniform thickness.

Referring to FIG. 7, the second ejecting operation is performed after the first drying operation. In the second ejecting operation, second organic light-emitting ink different from the first organic light-emitting ink may be ejected onto a second pixel region adjacent to the first pixel region, and a second solvent 610 may be ejected onto a region around the second pixel region. Here, the second pixel region may be a region including pixels 710 in which a green light-emitting layer 521 is formed, and the second organic light-emitting ink may be green ink 520. In addition, if the second organic light-emitting ink is ejected in the form of a line by line printing, the region around the second pixel region may be lines on both sides of the line of the ejected second organic light-emitting ink. In one embodiment, the green ink 520 may be ejected in the form of a line from an end of the substrate 200 to the other end of the substrate 200, and the second solvent 610 may be ejected in the form of lines on both sides of the ejected green ink 520. In one embodiment, for example, two lines of the green ink 520 and four lines of the second solvent 610 may be ejected. Here, the first solvent 600 and the second solvent 610 may have the same composition. In addition, when the second solvent 610 is ejected onto the region around the second pixel region, it may be ejected onto the already dried first pixel region. That is, as shown in FIG. 7, the second solvent 610 may be ejected onto the red light-emitting layer 511 formed as a result of drying the red ink 510.

In the second drying operation, the second organic light-emitting ink and the second solvent 610 may be dried after the second ejecting operation. The second organic light-emitting ink (e.g., the green ink 520) may be dried into an organic light-emitting layer 501 (e.g., the green light-emitting layer 521). In addition, the second solvent 610 may evaporate as it dries. As a result, all of the second solvent 610 may be removed. In particular, all of the second solvent 610 ejected onto the red light-emitting layer 511 may also be removed. Therefore, the red light-emitting layer 511 may remain in the same state as after the first drying operation. Since the green ink 520 is dried in a uniform drying atmosphere due to the presence of the second solvent 610 on both sides of the green ink 520, it can be formed into the green light-emitting layer 521 having a uniform thickness.

Figure 8:
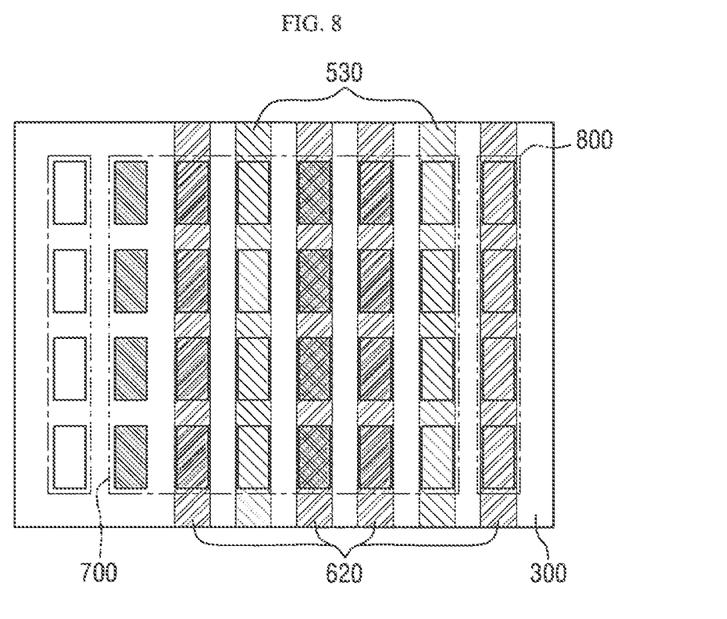

Referring to FIG. 8, the third ejecting operation is performed after the second drying operation. In the third ejecting operation, third organic light-emitting ink different from the second organic light-emitting ink may be ejected onto a third pixel region adjacent to the second pixel region, and a third solvent 620 may be ejected onto a region around the third pixel region. Here, the third pixel region may be a region including pixels 710 in which a blue light-emitting layer 531 is formed, and the third organic light-emitting ink may be blue ink 530. In addition, if the third organic light-emitting ink is ejected in the form of a line by line printing, the region around the third pixel region may be lines on both sides of the line of the ejected third organic light-emitting ink. In one embodiment, the blue ink 530 may be ejected in the form of a line from an end of the substrate 200 to the other end of the substrate 200, and the third solvent 620 may be ejected in the form of lines on both sides of the ejected blue ink 530. In one embodiment, for example, two lines of the blue ink 530 and four lines of the third solvent 630 may be ejected. Here, the third solvent 620 may have the same composition as the first solvent 600 and the second solvent 610. In addition, when the third solvent 620 is ejected onto the region around the third pixel region, it may be ejected onto the already dried second pixel region. That is, as shown in FIG. 8, the third solvent 620 may be ejected onto the red light-emitting layer 511 and the green light-emitting layer 521 formed as a result of drying the red ink 510 and the green ink 520.

In the third drying operation, the third organic light-emitting ink and the third solvent 620 may be dried after the third ejecting operation. The third organic light-emitting ink (e.g., the blue ink 530) may be dried into an organic light-emitting layer 501 (e.g., the blue light-emitting layer 531). In addition, the third solvent 620 may evaporate as it dries. As a result, all of the third solvent 620 may be removed. In particular, all of the third solvent 620 ejected onto the red light-emitting layer 511 and the green light-emitting layer 521 may also be removed. Therefore, the red light-emitting layer 511 and the green light-emitting layer 521 may remain in the same state as after the first drying operation and the second drying operation. Since the blue ink 530 is dried in a uniform drying atmosphere due to the presence of the third solvent 620 on both sides of the blue ink 530, it can be formed into the blue light-emitting layer 531 having a uniform thickness.

Figure 9:
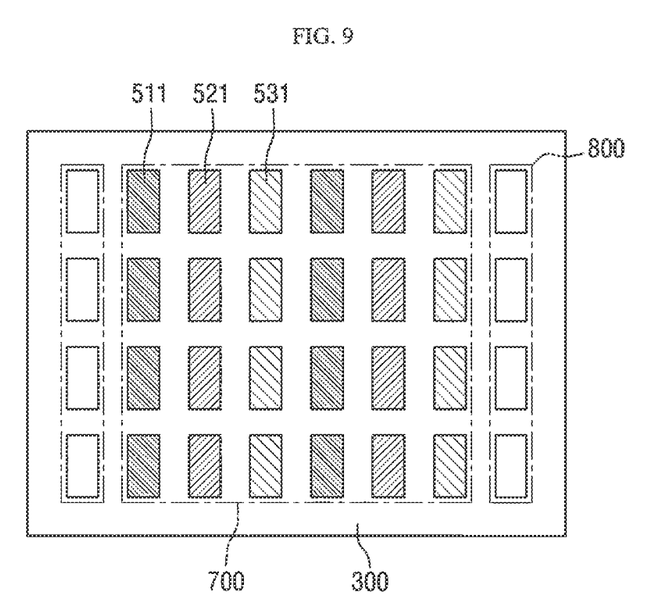

Referring to FIG. 9, after the third drying operation, all solvents on the substrate 200, that is, the first solvent 600, the second solvent 610, and the third solvent 620 may be removed as they evaporate. All organic light-emitting ink 500, that is, the red ink 510, the green ink 520, and the blue ink 530 may be dried into the red light-emitting layer 511, the green light-emitting layer 521, and the blue light-emitting layer 530, each having a uniform thickness. In addition, the dummy patterns of the dummy region 800 may remain in a final product or may be cut and discarded.

Figure 10:
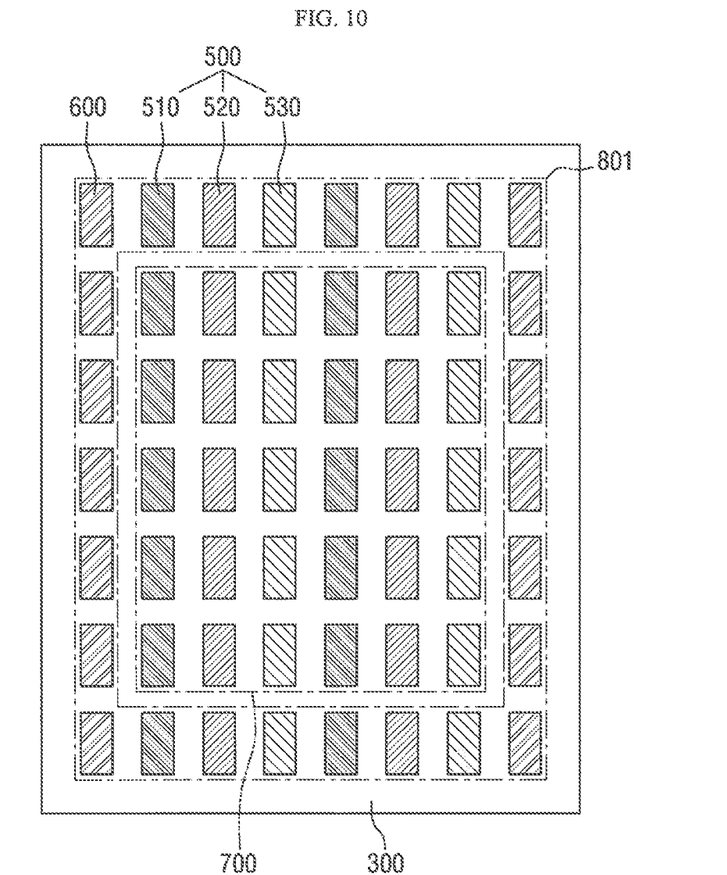
FIGS. 10 and 11 are plan views illustrating methods of manufacturing an organic luminescence display according to other embodiments of the present invention.
Figure 11:
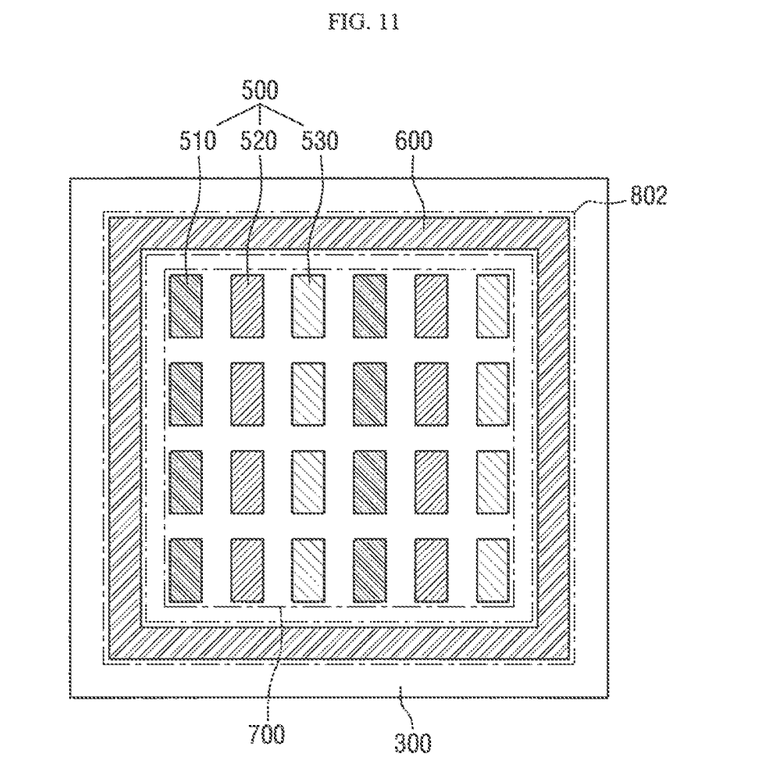

FIGS. 10 and 11 are plan views illustrating methods of manufacturing an organic luminescence display according to other embodiments of the present invention. For simplicity, elements which are the same as those of FIGS. 1 through 4 are indicated by like reference numerals, and repeated description thereof will be omitted.

Referring to FIG. 10, a dummy region 801 may be formed on a substrate 200 in a non-display region adjacent to all edges of a display region 700. That is, a plurality of dummy patterns shaped like a plurality of pixels 710 may surround all of the pixels 710. In addition, an inkjet printhead may selectively eject the organic light-emitting ink 500 or the first solvent 600 onto the pixels 710 and the dummy patterns in a dot printing manner. In this case, since the dummy patterns exist around all of the pixels 710, there may be no need to eject the organic light-emitting ink 500 or the first solvent 600 on a pixel defined layer 300.

Referring to FIG. 11, as in FIG. 10, a non-display region 802 may be formed on a substrate 200 in a non-display region adjacent to all edges of the display region 700. However, one dummy pattern may extend to surround all pixels 710. That is, the shape of the dummy pattern may be different from that of the pixels 710. In this case, since a single dummy pattern is formed, it may be easy to eject a first solvent 600 onto the dummy pattern.

As described above, according to embodiments of the present invention, ejected organic light-emitting ink is dried under a uniform concentration of evaporating solvent molecules. Therefore, an organic light-emitting layer having a uniform thickness can be formed. In addition, since a solvent that is relatively less costly than the organic light-emitting ink is used, material costs can be saved.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of manufacturing an organic luminescence display, the method comprising:
    ejecting a plurality of kinds of mixtures of an organic light-emitting material and a second solvent onto a plurality of pixels arranged on a substrate and ejecting a first solvent without the organic light-emitting material onto a pair of adjacent dummy patterns at opposite sides of the plurality of pixels concurrently with the ejecting of the mixtures, the plurality of pixels being between the pair of adjacent dummy patterns; and
    drying the mixture and the first solvent after ejecting the mixtures,
    wherein each of the organic light-emitting materials of the plurality of kinds of mixtures is configured to emit a different color from each other.

2. The method of claim 1, wherein the ejecting of the mixture and the first solvent is performed in a line printing manner using an inkjet printhead.

3. The method of claim 1, wherein the substrate includes a display region to display images and a non-display region to not display images, and the solvent is ejected in the form of a line onto the non-display region adjacent to at least one boundary of the display region.

4. The method of claim 3, wherein the non-display region includes the pair of adjacent dummy patterns.

5. The method of claim 1, wherein the first solvent and the second solvent have a same composition.

6. A method of manufacturing an organic luminescence display, the method comprising:
    first ejecting a first organic light-emitting ink onto a first pixel region of a substrate, and first ejecting a first solvent without the first organic light-emitting ink at opposite sides of the first pixel region;
    first drying the first organic light-emitting ink and the first solvent after first ejecting the first organic light-emitting ink; and
    after the first drying operation, second ejecting a second organic light-emitting ink different from the first organic light-emitting ink onto a second pixel region adjacent to the first pixel region and second ejecting a second solvent onto the first pixel region.

7. The method of claim 6, wherein the first solvent and the second solvent have a same composition.

* * * * *